(12) United States Patent
Maki et al.

(10) Patent No.: US 11,201,068 B2
(45) Date of Patent: Dec. 14, 2021

(54) HEAT TREATMENT APPARATUS, METHOD OF MANAGING HEAT TREATMENT APPARATUS AND STORAGE MEDIUM

(71) Applicant: TOKYO ELECTRON LIMITED, Tokyo (JP)

(72) Inventors: Junnosuke Maki, Koshi (JP); Shinichiro Misaka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 459 days.

(21) Appl. No.: 16/018,417

(22) Filed: Jun. 26, 2018

(65) Prior Publication Data

US 2019/0006208 A1    Jan. 3, 2019

(30) Foreign Application Priority Data

Jun. 28, 2017 (JP) .............................. JP2017-126648
Mar. 16, 2018 (JP) .............................. JP2018-049783

(51) Int. Cl.
*H01L 21/67* (2006.01)
*H01L 21/687* (2006.01)
(Continued)

(52) U.S. Cl.
CPC ......... *H01L 21/67103* (2013.01); *G06N 3/08* (2013.01); *G06N 5/045* (2013.01);
(Continued)

(58) Field of Classification Search
CPC .... G06N 3/08; G06N 5/045; H01L 21/67103; H01L 21/67248; H01L 21/67288;
(Continued)

(56) References Cited

U.S. PATENT DOCUMENTS

2012/0080832 A1* 4/2012 Woodard ............ H01L 21/6835
269/289 R
2016/0093519 A1* 3/2016 Higashi ............. H01L 21/67109
219/444.1
(Continued)

FOREIGN PATENT DOCUMENTS

JP    2009-123816 A    6/2009
JP    2016-066779 A    4/2016

*Primary Examiner* — Dana Ross
*Assistant Examiner* — Joe E Mills, Jr.
(74) *Attorney, Agent, or Firm* — Nath, Goldberg & Meyer; Jerald L. Meyer; Tanya E. Harkins (57) ABSTRACT

A heat treatment apparatus of heating a substrate mounted on a mounting plate heated by a heating part includes: plural types of physical quantity detecting parts for detecting plural types of physical quantities, respectively; a state estimating part for estimating an occurrence probability occurring for each of abnormality modes by a neural network, and including an input layer to which a group of time-series detection values obtained for each of physical quantity detection values detected respectively by the physical quantity detecting parts is inputted; and a selecting part for selecting one of correspondence processes based on the occurrence probability of each of the abnormality modes estimated by the state estimating part. One of the physical quantity detection values is a temperature detection value detected by a temperature physical quantity detecting part for detecting a temperature of the mounting plate among the physical quantity detecting parts.

13 Claims, 9 Drawing Sheets

(51) Int. Cl.
*H05B 3/22* (2006.01)
*G06N 3/08* (2006.01)
*H01L 21/683* (2006.01)
*G06N 5/04* (2006.01)
*H05B 1/02* (2006.01)

(52) U.S. Cl.
CPC .. *H01L 21/67248* (2013.01); *H01L 21/67288* (2013.01); *H01L 21/6838* (2013.01); *H01L 21/68714* (2013.01); *H05B 1/0233* (2013.01); *H05B 3/22* (2013.01)

(58) Field of Classification Search
CPC .......... H01L 21/6838; H01L 21/68714; H05B 1/0233; H05B 3/22
See application file for complete search history.

(56) References Cited

U.S. PATENT DOCUMENTS

2017/0215230 A1* 7/2017 Parkhe .............. H01L 21/67248
2019/0362221 A1* 11/2019 Ando ................. G01N 21/9501

* cited by examiner

| Abnormality mode | Process continuation | Process continuation +warning | Process continuation +warning +wafer marking | Process stop |
|---|---|---|---|---|
| Wafer warping | less than 10% | 10~50% (less than) | 50~80% (less than) | more than 80% |
| Wafer riding | less than 10% | 10~30% (less than) | 30~50% (less than) | more than 50% |
| VAC solenoid breakdown | less than 10% | 10~20% (less than) | 20~40% (less than) | more than 40% |
| Hot plate cracking | less than 10% | 10~20% (less than) | 20~30% (less than) | more than 30% |

FIG. 9

HEAT TREATMENT APPARATUS, METHOD OF MANAGING HEAT TREATMENT APPARATUS AND STORAGE MEDIUM

CROSS-REFERENCE TO RELATED APPLICATIONS

This application is based upon and claims the benefit of priority from Japanese Patent Application Nos. 2017-126648, and 2018-049783, filed on Jun. 28, 2017 and Mar. 16, 2018, respectively, the entire contents of which are incorporated herein by reference.

TECHNICAL FIELD

The present disclosure relates to a technique for estimating an abnormality mode based on detection results of a plurality of physical quantities such as a temperature of the mounting plate and performing a process corresponding to the estimated abnormality mode, in an apparatus for heating a substrate mounted on the mounting plate heated by a heating part.

BACKGROUND

In a process of manufacturing a semiconductor device, for example, a series of processes for forming a resist pattern includes a heat treatment of heating a semiconductor wafer (hereinafter abbreviated as a "wafer"). Examples of the heat treatment may include a step of coating a resist on a wafer and then volatilizing a solvent from the resist, a step of diffusing acid generated in a resist film by exposure, a step of heating the resist film after development, and the like. Without being limited to the formation of the resist pattern, the heat treatment may include a step of coating a coating solution containing a precursor of a silicon oxide film on the wafer and then heating the wafer to cause a crosslinking reaction of the precursor.

As an apparatus for performing such a heat treatment, an apparatus has been used which includes a heat plate serving as a mounting table disposed in a processing container and equipped with a heater installed in the bottom of the heat plate or inside the heat plate. In such an apparatus, a wafer is mounted on the heat plate while slightly floating from a mounting surface of the mounting table through a plurality of protrusions called gap pins or the like. However, for example, when the heat treatment apparatus is in operation, foreign matter may adhere onto the mounting table and the wafer may be placed on the foreign matter. In addition, the mounting table (heat plate) may break in some cases. When such an abnormality occurs, appropriate heat treatment cannot be performed on the wafer.

In this connection, a technique is used that integrates a difference between a detection value of a surface temperature of a bake plate and a set temperature, and monitoring the integral value to detect an abnormality. In this technique, when a wafer is accurately mounted on the bake plate, the surface temperature of the bake plate temporarily decreases to increase the integral value. However, if the wafer is mounted on the bake plate while being tilted, the integral value is decreased. Another technique has also been used in which one of a plurality of temperature detection values provided on a heat plate is regarded as a mass and the center of gravity of the temperature is obtained so as to detect an abnormal vertical position of the center of the wafer due to wafer loading, wafer warping or the like by particles existing on the heat plate.

Besides loading the wafer on foreign matter and the loading of a wafer having a large warping, the mode of an abnormality occurring during the operation of the heat treatment apparatus may include cracking of the mounting table as described above, a failure of a vacuum valve which turns on and off a vacuum chuck installed in the mounting table, or the like. In the above-described conventional techniques, even when another abnormality other than the abnormal mode to be detected occurs, it is determined that such an abnormality has occurred. However, since modes of abnormality are not distinguished from each other, it is difficult to take appropriate measures against the occurrence of an abnormality in some cases.

SUMMARY

Some embodiments of the present disclosure provide a technique capable of taking appropriate measures against an abnormality occurring during operation of a heat treatment apparatus.

According to one embodiment of the present disclosure, there is provided a heat treatment apparatus that includes a mounting plate and heats a substrate mounted on the mounting plate heated by a heating part, the mounting plate being disposed inside a processing container and having a plurality of protrusions formed on a surface of the mounting plate to avoid contact between the substrate and the surface of the mounting plate, including: a plurality of types of physical quantity detecting parts configured to detect a plurality of types of physical quantities set as operation conditions, respectively; a state estimating part configured to estimate an occurrence probability occurring for each of a plurality of abnormality modes by a neural network, the state estimating part including an input layer to which a group of time-series detection values obtained for each of a plurality of types of physical quantity detection values detected respectively by the plurality of types of physical quantity detecting parts is inputted; and a selecting part configured to select one of a plurality of correspondence processes based on the occurrence probability of each of the plurality of abnormality modes estimated by the state estimating part, wherein one of the plurality of types of physical quantity detection values is a temperature detection value detected by a temperature physical quantity detecting part configured to detect a temperature of the mounting plate among the plurality of types of physical quantity detecting parts.

According to another embodiment of the present disclosure, there is provided a method of managing a heat treatment apparatus that includes a mounting plate and heats a substrate mounted on the mounting plate heated by a heating part, the mounting plate being disposed inside a processing container and having a plurality of protrusions formed on a surface of the mounting plate to avoid contact between the substrate and the surface of the mounting plate, the method including: detecting a plurality of types of physical quantities set as operation conditions at least in a time zone after the substrate is mounted on the mounting plate; inputting a group of time-series detection values obtained for each of a plurality of types of physical quantity detection values detected in the detecting to an input layer, and obtaining an occurrence probability occurring for each of a plurality of abnormality modes by a neural network; and selecting one of a plurality of correspondence processes based on the occurrence probability of each of the plurality of abnormality modes, wherein one of the plurality of types of physical quantity detection values is a temperature detection value of the mounting plate detected in the detecting.

According to another embodiment of the present disclosure, there is provided a non-transitory computer-readable storage medium storing a computer program used for a heat treatment apparatus that includes a mounting plate and heats a substrate mounted on the mounting plate heated by a heating part, the mounting plate being disposed inside a processing container and having a plurality of protrusions formed on a surface of the mounting plate to avoid contact between the substrate and the surface of the mounting plate, wherein the computer program includes a group of steps organized to perform the aforementioned method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
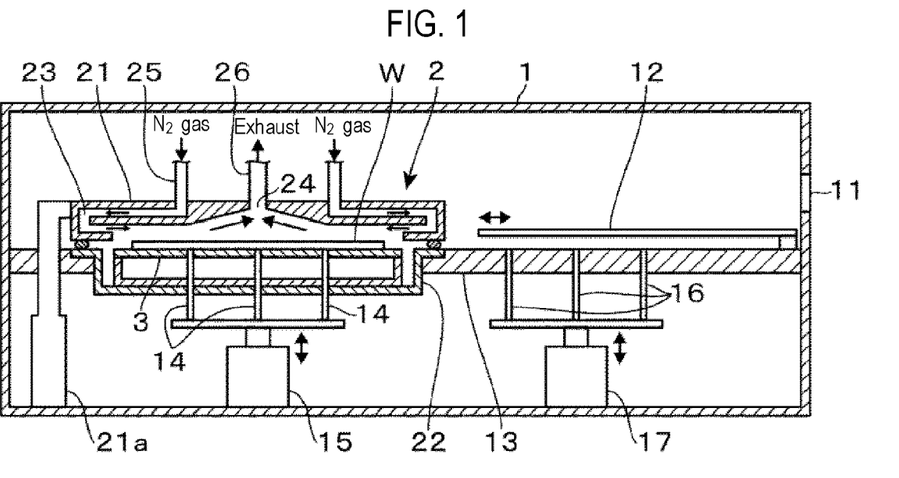
FIG. 1 is a longitudinal sectional side view showing a main body of a heat treatment apparatus according to an embodiment of the present disclosure.

FIG. 1 is a view showing a main body (heat treatment module) of a heat treatment apparatus according to an embodiment of the present disclosure. Reference numeral 1 denotes a housing constituting an outer covering body and reference numeral 11 denotes a transfer port through which a wafer used as a substrate passes. A heat treatment part 2 for thermally treating the substrate is provided at the inner side when viewed from the transfer port 11. A wafer transfer mechanism 12 is on standby in front of the heat treatment part 2. The wafer transfer mechanism 12 transfers a wafer received from an external main transfer mechanism via the transfer port 11 to the heat treatment part 2 and serves also as a cooling plate. The heat treatment part 2 includes a lid 21 that constitutes a portion of a processing container and a base 22 that constitutes the processing container together with the lid 21. The base 22 is installed in a partition plate 13. The partition plate 13 partitions an upper region (upper atmosphere) in which the wafer W is arranged from a lower region in which mechanism parts are arranged, and is configured as a flat cylindrical body with an opened top. The processing container is configured to be opened and closed by an opening/closing mechanism 21a that lifts up/down the lid 21.

A heat plate 3 serving also as a mounting plate for the wafer W is installed inside the processing container. The configuration of the heat plate 3 will be described later. The lid 21 includes a gas supply passage 23 formed in an outer peripheral portion to supply a purge gas and an exhaust port 24 formed in a central portion to exhaust the interior of the lid 21. The gas supply passage 23 is connected to a purge gas supply part (to be described later) via a gas supply path 25. The exhaust port 24 is connected to one end of an exhaust path 26 whose other end is connected to a factory exhaust part. In FIG. 1, reference numeral 14 denotes lift pins for delivering a wafer W between the wafer transfer mechanism 12 and the heat plate 3. In this example, the lift pins 14 penetrate through the base 22 and the heat plate 3 and are configured to move up/down by an elevating mechanism 15. The lift pins 14 are installed in three locations. Reference numeral 16 denotes lift pins for delivering the wafer W between the external main transfer mechanism and the wafer transfer mechanism 12. The lift pins 16 penetrate through the partition plate 13 and an arm portion of the wafer transfer mechanism 12 and are configured to move up/down by an elevating mechanism 17.

Figure 2:
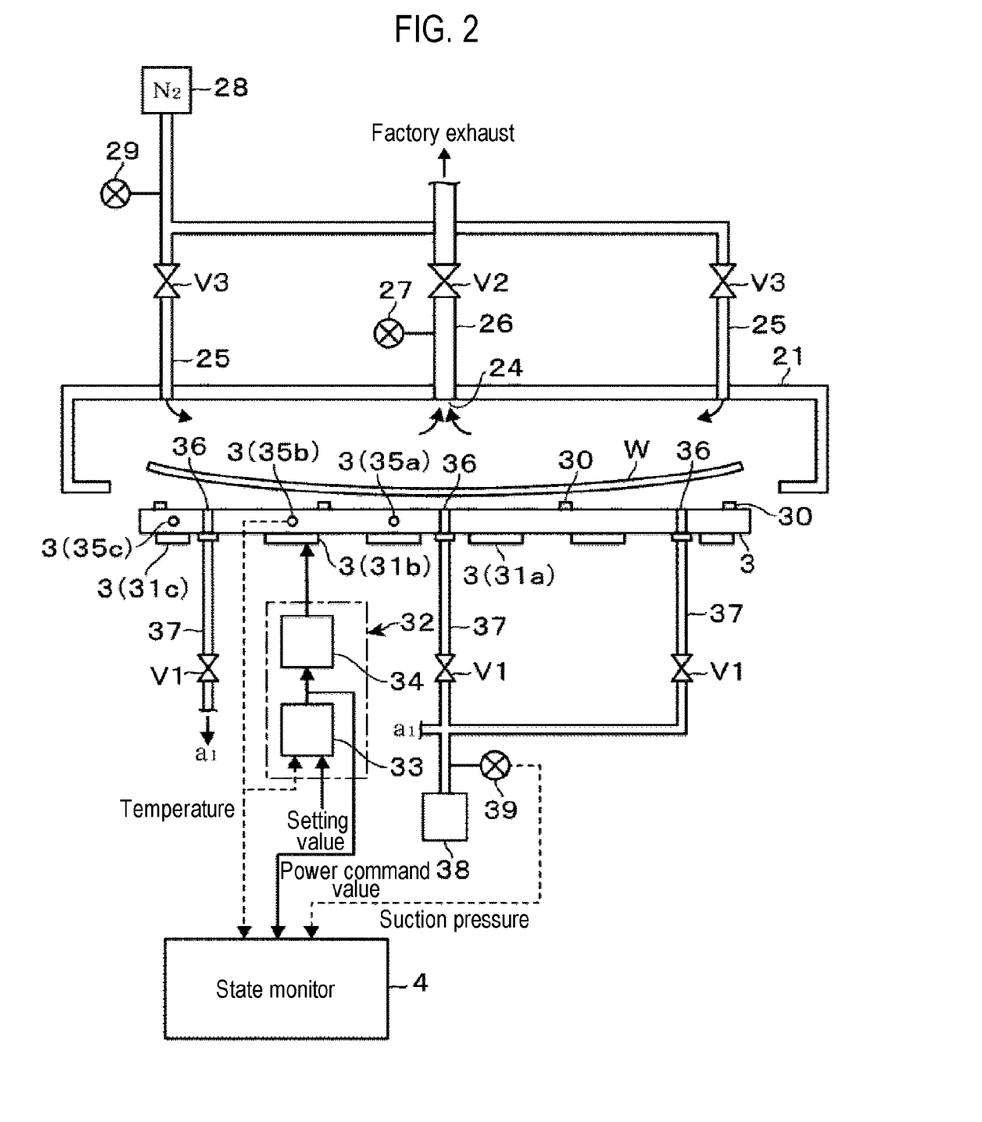
FIG. 2 is a configuration diagram including a schematic diagram of major parts of the main body, a physical quantity detecting part and a state monitoring part.

FIG. 2 is a configuration diagram schematically showing a portion related to the heat plate 3 and a portion related to a power supply system. Heaters 31a to 31c composed of resistance heating elements are installed on, for example, a lower surface of the heat plate 3. The heat plate 3 is divided into a plurality of heating zones in which temperatures are controlled independently of one another. In this example, for the sake of convenience, it is assumed that the heat plate 3 is divided into three heating zones, including a circular central heating zone centered at the center of the heat plate 3 and two annular peripheral heating zones formed in a concentric relationship outside the circular central heating zone. That is to say, in this example, three divided heating zones are formed in the radial direction of the heat plate 3. Accordingly, the heaters 31a to 31c are installed to correspond to the three heating zones. In some embodiments, a layout may be employed in which the heating zones are divided in the heat plate 3 in the radial direction and areas thus divided are further divided in the circumferential direction.

A power control circuit is connected to each of the heaters 31a to 31c. In FIG. 2, for the sake of convenience, a power control circuit 32 corresponding to the heater 31b is shown. Further, temperature sensors 35a to 35c used as a temperature detection part for detecting a temperature of the heat plate 3 are installed in the heat plate 3. More specifically, the temperature sensors 35a to 35c are installed in the heat plate 3 to detect temperatures of the three heating zones described above. The temperature sensors 35a to 35c are attached to a surface of the heat plate 3. In FIG. 2, the temperature sensors 35a to 35c are shown to be installed inside the heat plate 3.

The power control circuit 32 includes an output part 33 configured to output a power command value and a power supply part 34 configured to supply power to the heater 31b based on the power command value.

Figure 3:
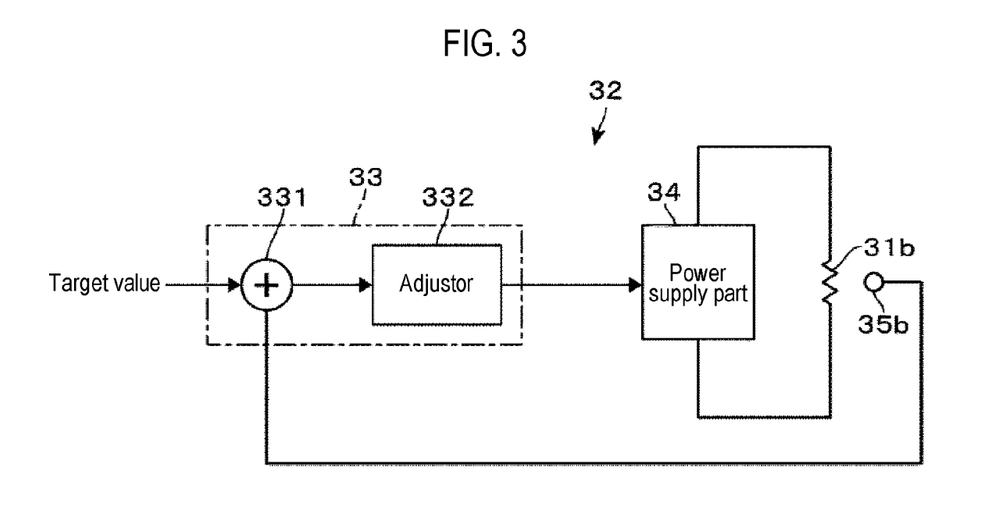
FIG. 3 is a block circuit diagram showing a portion of a circuit for controlling power of a heater used in the heat treatment apparatus.

As shown in FIG. 3, the output part 33 includes an adder 331 which extracts a deviation between a temperature target value and a temperature detection value detected by the temperature sensor 35b, and an adjustor 332 which performs, for example, a PID calculation, on the deviation and outputs the power command value. The adjustor 332 is configured by, for example, an amplifier having a function of the PID calculation. The power supply part 34 includes, for example, an AC power supply, a switching element and the like and is configured to control a phase of an AC voltage with a duty ratio corresponding to the power command value.

Returning to FIG. 2, in order to prevent a lower surface of the wafer W from coming into contact with the surface (mounting surface) of the heat plate 3, a plurality of gap pins 30 used as protrusions with a height of about 0.3 to 0.5 mm are formed on the surface of the heat plate 3. Further, the heat plate 3 has a plurality of suction holes 36 opened in the surface of the heat plate 3. The suction holes 36 are connected to respective suction paths 37. The suction paths 37 are joined at the upstream side and are connected to a suction mechanism 38. Valves (suction valves) V1 are installed in the respective suction paths 37. A suction pressure detector 39 which is a pressure gauge for detecting a suction pressure is installed in a junction path where the suction paths 37 are joined with each other. The suction holes 36 are used to make the wafer W flat by suctioning the lower surface of the wafer W when the wafer W is warped. For example, the suction holes 36 are formed in the central portion of the heat plate 3 and at positions close to the outer peripheral portion of the wafer W in the circumferential direction. In FIG. 2, the layout of the gap pins 30 and the suction paths 37 is shown for the sake of convenience but does not represent an example of an actual machine. Further, the wafer W is shown to be separated from the gap pins 30 for the sake of convenience in description.

The power supply system applied to the lid 21 will now be described. Two inlets of the gas supply passage 23 described above are formed in a symmetric relationship with, for example, the center of the lid 21. The gas supply passages 25 connected to the respective inlets are joined at the upstream side and are connected to, for example, a gas supply source 28 for supplying a purge gas such as a nitrogen gas. In FIG. 2, reference symbols V2 and V3 denote valves.

A process recipe that specifies a procedure of process and setting values of parameters required for such a process is used to operate the heat treatment apparatus. The process recipe is stored in a memory of a control part. The temperature of the heat plate 3 (specifically, the target temperature of each heating zone) and the suction pressure of the suction path 37 (specifically, the target value of the suction pressure of the joined portion) correspond to the above-mentioned parameters as physical quantities. Therefore, these physical quantities are set as operation conditions of the apparatus. The temperature sensors 35a to 35c and the suction pressure detector 39 correspond to plural types of physical quantity detecting parts for respectively detecting plural kinds of physical quantities. In this embodiment, the power command value is handled as one of the input values of a neural network 5. Thus, the power command value is one of the physical quantity detection values. The adjustor 332 corresponds to a physical quantity detecting part. The power command value is changed according to a temperature detection value which is a physical quantity set as the operation conditions of the apparatus. That is to say, the power command value is changed according to the amount of heat generated by the heater 31. Thus, the power command value can be handled as a physical quantity detection value. For this reason, it can be said that the adjustor 332 is a physical quantity detecting part. In some embodiments, a power detector may be used to detect the supply power of the heater 31a to 31c, and a power detection value thus detected may be used as one of the input values of the neural network 5 instead of or in addition to the power command value. The power detector corresponds to a physical quantity detecting part, and the power detection value corresponds to a physical quantity detection value.

As shown in FIG. 2, the heat treatment apparatus of the present embodiment includes a state monitoring part 4. Power command values provided from the temperature sensors 35a to 35c, the suction pressure detector 39 and the output parts 33 corresponding to the heaters 31a to 31c are inputted to the state monitoring part 4. The temperature sensors 35a to 35c and the heaters 31a to 31c will be sometimes collectively denoted by reference numerals such as "35" and "31", respectively.

Figure 4:
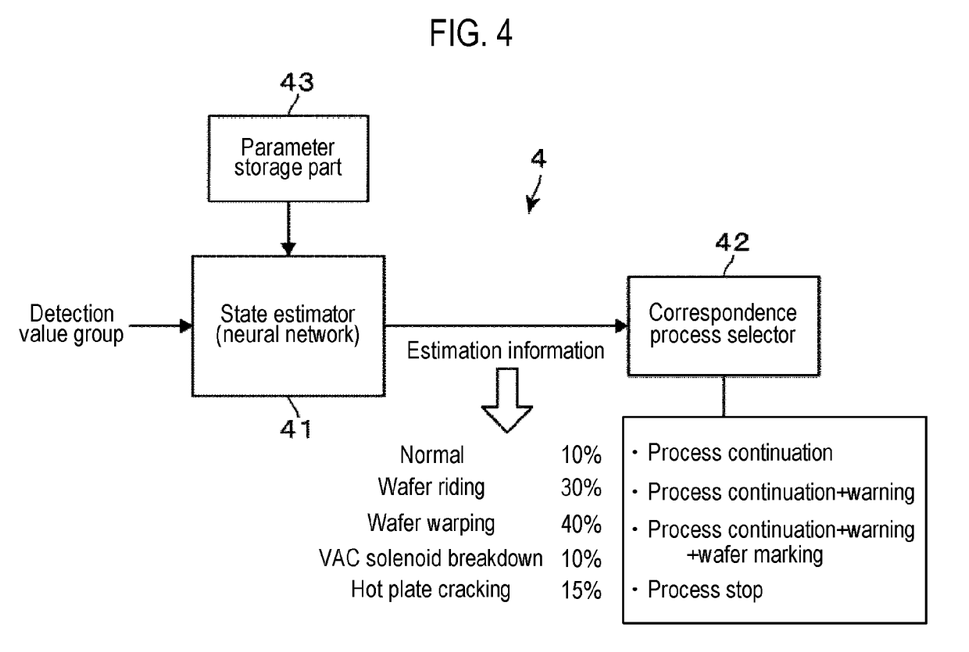
FIG. 4 is a block diagram showing a configuration of the state monitoring part.

As shown in FIG. 4, the state monitoring part 4 includes a state estimating part 41 and a correspondence process selecting part 42. The state estimating part 41 is composed of a neural network to which the detection values (including the power command value) are inputted, and obtains an occurrence probability for each of a plurality of predetermined event modes. The plurality of event modes is used as a term that encompasses a plurality of abnormality modes and a plurality of normality modes. The plurality of abnormality modes refers to an abnormal mode of the heat treatment apparatus, an abnormality of the mounting state of the wafer W, and a state in which a degree of warping of the wafer is larger than a predetermined degree. In FIG. 4, for the sake of a clear understanding, occurrence probabilities for normality, wafer boarding, wafer warping, cracking of the heat plate 3 (damage of the heat plate 3), breakdown of a solenoid of the suction valve V1 (solenoid for actuating an electromagnetic valve) are additionally illustrated. Numerical values of the occurrence probabilities are values for the sake of a clear understanding. Reference numeral 43 denotes a parameter storage part that stores parameters used for operations in the neural network. Values of the parameters are determined by repeated supervised learning (with correct label).

The correspondence process selecting part 42 has a function of selecting a correspondence process out of a plurality of predetermined correspondence processes based on information estimated by the state estimating part 41 (the occurrence probability of each event mode). In FIG. 4, a correspondence process of a selected event is described in a box accompanying the correspondence process selecting part 42. In this example, the correspondence process is defined with four levels including process continuation (level 1), process continuation+warning (level 2), process continuation+warning+wafer marking (level 3) and process stop (level 4). The correspondence process and the levels will be described later. Examples of the warning may include: displaying, on an operation screen of the heat treatment apparatus, an option through which an operator checks the occurrence probability of an abnormality mode and determines whether or not to continue the process; issuing an alarm sound; and turning on a warning lamp, for example.

An example of the wafer marking process may include putting a mark on process history data of a lot including a wafer. In a semiconductor manufacturing factory, wafers are accommodated in a transfer container on a unit of lot and are loaded into each processing station. A computer in the factory records the process history of wafers of each lot. A predetermined mark is put on the data thus recorded. This leads itself to analyze the inspection results of the wafer. The wafer marking may be a process of directly marking a predetermined portion of the wafer with ink. In other words, the wafer marking process is a process of marking directly on data or a wafer in order to indicate that the respective wafer has been processed in a state where there is a concern that an abnormality mode will occur later.

Figure 5:
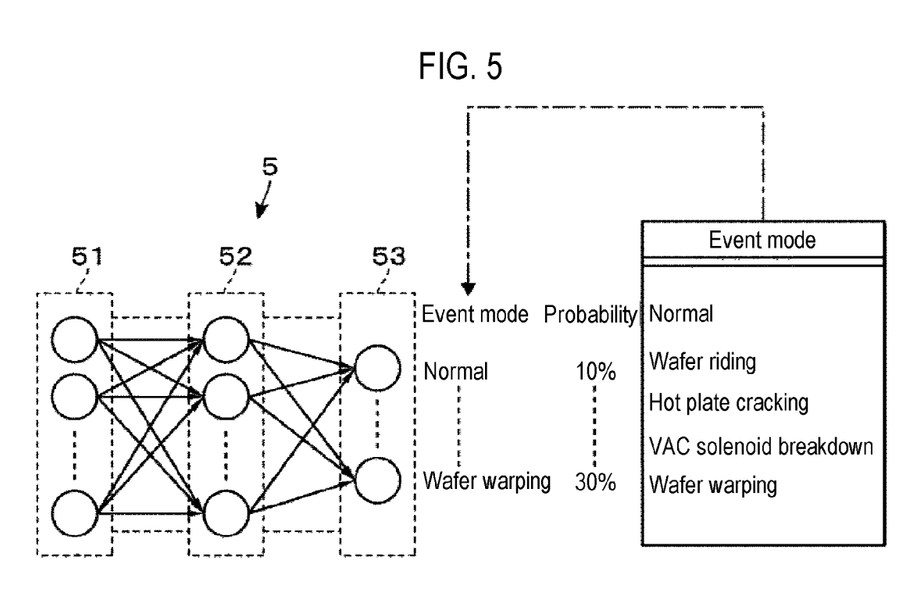
FIG. 5 is an explanatory view showing a state estimating part for obtaining an occurrence probability occurring for each of a plurality of abnormality modes by a neural network.

FIG. 5 is an explanatory view showing the neural network 5 in association with an event mode. Reference numerals 51 to 53 denote an input layer, a hidden layer (intermediate layer) and an output layer of the neural network 5, respectively. The number of nodes of the input layer 51 is determined depending on the number of input data. The input data are time-series data of detection values of a physical quantity. In this example, the input data is time-series data of the detection values of the temperature sensors 35a to 35c, the detection value of the suction pressure detector 39, and the power command values from the respective output parts 33 corresponding to the heaters 31a to 31c (MV (Manipulated Variable) which is an output signal of the adjustor 332). The time-series data is a detection value group obtained by sampling a physical quantity at predetermined time intervals in a predetermined time zone. The predetermined time zone is a time zone at least after mounting the wafer W on the heat plate 3. For example, assuming that a time at which the temperature of the heat plate 3 drops down once due to the mounting of the wafer W on the heat plate 3 and then rises and becomes stable is a time t1, the predetermined time zone is a time zone immediately before the wafer W is loaded onto the heat plate 3, for example, from several seconds to time t1. The sampling interval is set to, for example, about 0.1 to 0.3 seconds but may be arbitrarily set as long as it is a time interval at which a result intended by a producer with respect to the neural network 5 can be obtained.

The predetermined time zone is assumed to be, for example, 40 seconds, and the sampling interval is assumed to be, for example, 0.2 seconds. In this example, since three channels of the heaters 31 are provided, the total number of time-series data is 1,400 (=temperature detection values+power command values+suction pressure detection values=3×200+3×200+200), and the number of nodes of the input layer 51 is 1,400. In this case, assuming that the input layer 51 shown in FIG. 5 has a node 1, a node 2, . . . from the upper stage side, the time-series data of various physical quantity detection values are sequentially assigned to the respective nodes in such a manner that the time-series data of the temperature sensor 35a are assigned to the nodes 1 to 200, the time-series data of the temperature sensor 35b are assigned to the nodes 201 to 400, the time-series data of the temperature sensor 35c are assigned to the nodes 401 to 600, and the time-series data of the power command values of the heater 31a are assigned to the nodes 601 to 800.

The number of nodes of the output layer 53 corresponds to the number of event modes. FIG. 5 illustrates an event mode. The number of nodes is five. From each node of the output layer 53, the occurrence probability of the event mode assigned to the respective node is obtained. In the event mode, the term "wafer boarding" means a state in which foreign matter having a height greater than that of the gap pins 30 is placed on the heat plate 3 and the wafer W is loaded onto the foreign matter. The foreign matter includes fragments of the wafer W, dropped parts, fragments of resin parts, and the like. The term "heat plate cracking" refers to a form of damage to the heat plate 3, in which the heat plate 3 is cracked and damaged. The term "VAC solenoid breakdown" refers to a malfunction of a solenoid of a driving part of the valve V1 which opens and closes the suction path 37, in which the valve V1 remains closed. The term "wafer warping" corresponds to one of states in which the peripheral edge of the wafer is warped upward, warped downward, and is twisted in saddle shape. That is to say, the wafer warping refers to a state in which the degree of deformation exceeds an assumed degree. The number of nodes of the hidden layer 52 is determined by the number of nodes when a result intended by a producer is not obtained initially with few nodes at a stage where the neural network 5 is being learned and the intended result is obtained by re-learning with the increased number of nodes.

Figure 6:
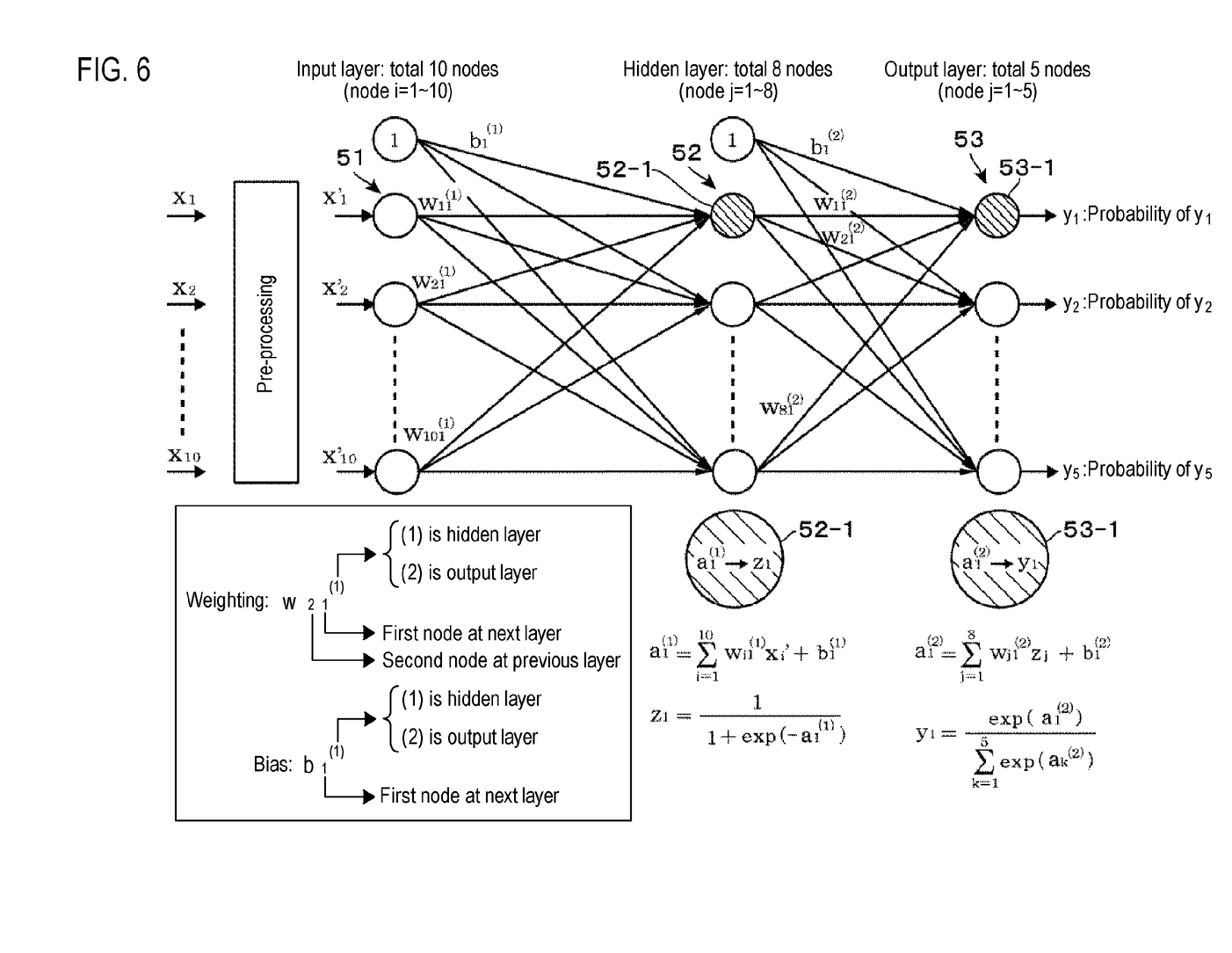
FIG. 6 is an explanatory view showing details of an example of the neural network.
Figure 7:
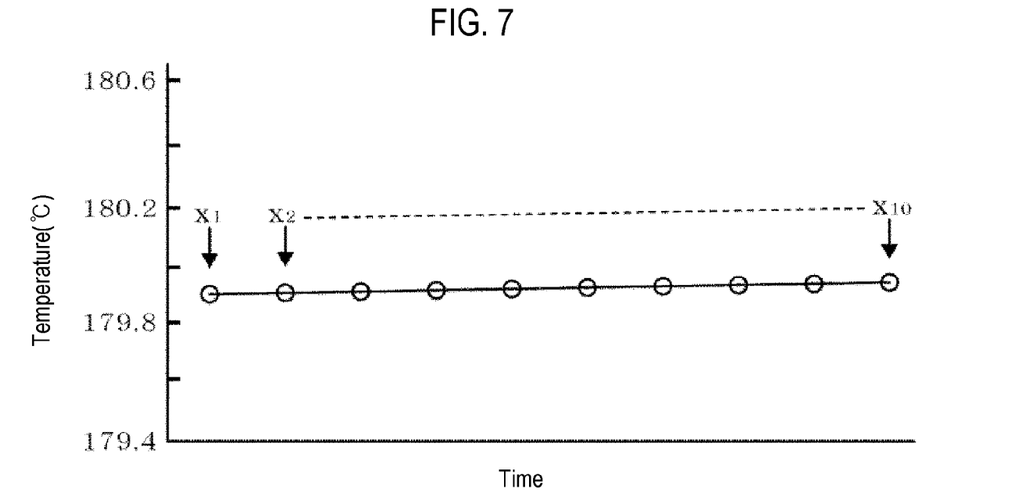
FIG. 7 is a graph schematically showing an example of input values inputted to the neural network.

FIG. 6 schematically shows an example of the neural network 5 and also shows the details of a process to be executed. In this example, for the sake of convenience in description, it is assumed that the number of nodes of the input layer 51 is 10, the number of nodes of the hidden layer 52 is 8, and the number of nodes of the output layer 53 is 5. $X_1$ to $X_{10}$ represent time-series data of the physical quantity detection values, and an image thereof is shown in FIG. 7. FIG. 7 shows time-series data of the temperature detection values detected by the temperature sensor 35, in which $X_1$ to $X_{10}$ represent sampling values of the temperature detection values.

Returning to FIG. 6, the time-series data $X_1$ to $X_{10}$ are preprocessed by a pre-processing part 50. The time-series data which have been subjected to the pre-processing are denoted by $X_1'$ to $X_{10}'$. The pre-processing may be, for example, either a data normalizing process as shown in the following equation (1) or a data standardizing process as shown in the following equation (2).

$$X_j'=(X_j-X[\min])/(X[\max]-X[\min]) \qquad (1)$$

where, X[max] and X[min] represent the maximum value and the minimum values of $X_1$ to $X_{10}$, respectively.

$$X_j'(X_j-X[\mathrm{ave}])/\sigma \qquad (2)$$

where, X[ave] represents the mean value of $X_1$ to $X_{10}$ and σ represents the standard deviation.

The denominators of equations (1) and (2) are indexes indicating a distribution of the time-series data. Therefore, it can be said that the pre-processing is a process of obtaining an index indicating the position of each data in the distribution of time-series data, for example, an index expressed by a value between 0 and 1.

A coupling load from a node at an i-th stage of the input layer 51 to a node at a j-th stage of the hidden layer 52 is denoted by $W_{ij}^{(1)}$. The total sum of weights at the node at the j-th stage of the hidden layer 52 is handled as $a_j^{(1)}$. In FIG. 6, an equation of the total sum of weights is representatively illustrated by the uppermost node 52-1 of the hidden layer 52. An output at the node at the j-th stage of the hidden layer 52 is denoted by $Z_j$. In FIG. 6, the output is representatively illustrated by the uppermost node 52-1 of the hidden layer 52.

A coupling load from a node at the j-th stage of the hidden layer 52 to a node at a k-th stage of the output layer 53 is denoted by $W_{ij}^{(2)}$. The total sum of weights at the node at the k-th stage of the output layer 53 is denoted by $a_k^{(2)}$. In FIG. 6, an equation of the total sum of weights is representatively illustrated by the uppermost node 53-1 of the output layer 53. An output at the node at the k-th stage of the output layer 53 is denoted by $y_k$. In FIG. 6, the output is representatively illustrated by the uppermost node 53-1 of the output layer 53.

Event modes are assigned to five nodes of the output layer 53. Wherein, yk represents the occurrence probability of each event mode. In each of the nodes of the input layer 51 and the hidden layer 52, a portion surrounded by a circle where "1" is a portion that outputs biases $b_1^{(1)}$ and $b_1^{(2)}$. In the actual neural network 5, as described above, the number of nodes of the input layer 51 corresponds to the sum value of time-series data of each physical quantity detection value, and the number of nodes of the output layer 53 corresponds to the number of event modes. The number of nodes of the hidden layer 52 is set to an appropriate number at a learning stage.

Figure 8:
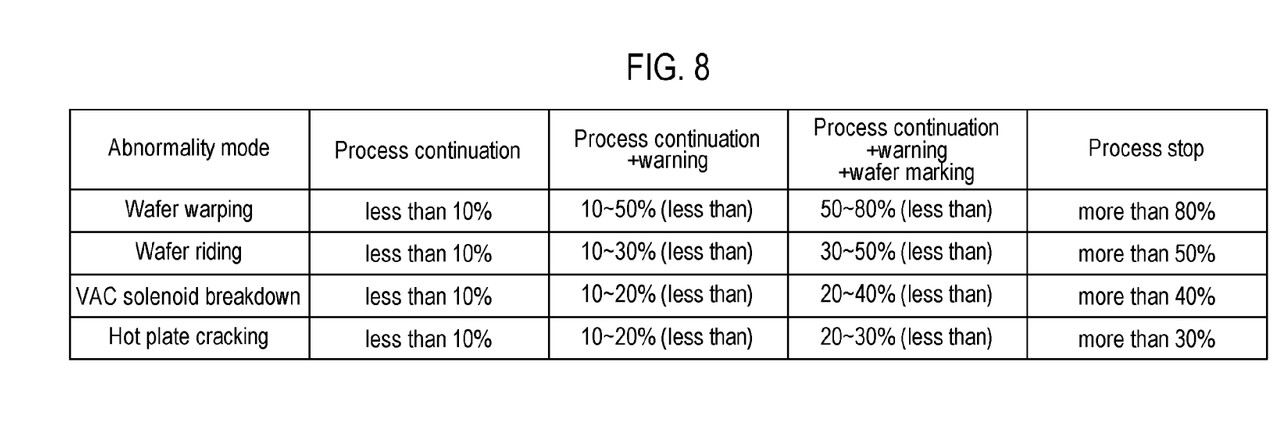
FIG. 8 is an explanatory view showing a relationship between an occurrence probability of the abnormality mode and a correspondence process.

FIG. 8 is a table showing an example of how to select the above-described four correspondence processes based on the occurrence probability of each abnormality mode except for the normality mode among the event mode occurrence probabilities obtained by the neural network 5, namely a table in which the occurrence probabilities and the correspondence processes are associated with each other. For example, if the occurrence probability of the wafer warping is less than 10%, the process is continued. If the occurrence probability of the wafer boarding is 20%, the process is continued but a warning is issued. If the occurrence probability of the heat plate cracking is 20%, a wafer marking is performed in addition to the continuation of the process and the issue of the warning. If the occurrence probability of the wafer boarding is 60%, the process is stopped. The levels of the correspondence processes shown in FIG. 8 are arranged in the order of Level 1, Level 2, Level 3 and Level 4 from the left side as described above and become higher toward the right side. For these four Levels 1 to 4 (four correspondence processes), a larger level value means a higher occurrence probability of each abnormality mode. Among different abnormality modes, it can be said that different occurrence probabilities at the same level have a greater effect of abnormality estimated for the wafer processing for an abnormality mode set with a lower occurrence probability (for example, at the level of "process stop", the occurrence probability of "heat plate cracking" is lower than that of "wafer warping"). In a case where conditions for selecting a plurality of correspondence processes are established corresponding to the occurrence probability of each of the plurality of abnormality modes, the correspondence process of the highest level (largest numerical value) among the plurality of correspondence processes is selected. In a more specific example, it is assumed that the occurrence probability of wafer warping is 40%, the occurrence probability of wafer boarding is 25%, the occurrence probability of VAC solenoid breakdown is 8% and the occurrence probability of heat plate cracking is 35%. In this case, the correspondence process selected from the wafer warping occurrence probability is "process continuation+warning (Level 2)". The correspondence process selected from the wafer boarding occurrence probability is also "process continuation+warning (Level 2)". The correspondence process selected from the VAC solenoid breakdown occurrence probability is "process continuation (Level 1)", and the correspondence process selected from the heat plate cracking occurrence probability is "process stop (Level 4)". In the case where the conditions with which the plurality of correspondence processes can be selected are established in this way, the process stop (Level 4) which is the highest level correspondence process is selected. The table shown in FIG. 8 and software for selecting a correspondence process using this table constitute the correspondence process selecting part 42.

The range of occurrence probability of each correspondence process shown in FIG. 8 is merely an example and it is determined as appropriate by repetition of the operation or by a user management method of the apparatus. The correspondence process is not limited to the example described above but may be a process such as check of the operation of the physical quantity detecting part itself such as the suction pressure detector 39, inspection of a circuit that supplies power to the heater 31, or the like.

The state estimating part 41, the correspondence process selecting part 42 and the parameter storage part 43 are constituted by, for example, a computer. The computer includes a program organized with a group of instructions to input a physical quantity detection value, calculate an occurrence probability of each event mode by the neural network 5 and select a correspondence process, and software including the table shown in FIG. 8, for example.

Figure 9:
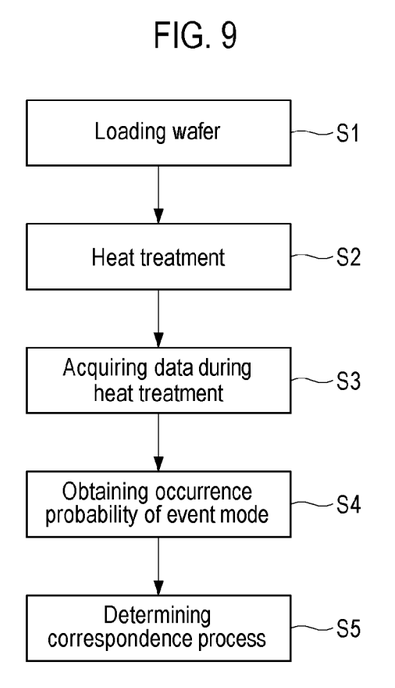
FIG. 9 is a flowchart showing the operation of the embodiment of the present disclosure.

Next, the operation of the above embodiment will be described. FIG. 9 is a flowchart showing the overall flow of the operation of the heat treatment apparatus of this embodiment. An unprocessed wafer W is loaded from the transfer port of the housing 1 onto the wafer transfer mechanism 12 (specifically, a cooling arm constituting the wafer transfer mechanism 12) inside the housing 1 by an external main transfer mechanism through the lifting operation of the lift pins 16 (step S1). Thereafter, the wafer W is transferred above the heat plate 3 by the wafer transfer mechanism 12 and is mounted on the heat plate 3 through the lifting operation of the lift pins 14. Specifically, the wafer W is supported by the gap pins 30 while slightly floating from the mounting surface.

Subsequently, after the wafer transfer mechanism 12 is withdrawn and moved to a standby position, the lid 21 descends and is brought into close contact with the base 22 so that a space in which the wafer W is placed is hermetically sealed. Thereafter, a purge gas is supplied from the vicinity of the outer peripheral portion of the lid 21 into the processing container composed of the lid 21 and the base 22 and is exhausted from the central portion of the lid 21.

The heat plate 3 is heated to a process temperature of, for example, 80 to 200 degrees C. before the wafer W is mounted on the heat plate 3. The wafer W is placed on the heat plate 3 and the temperature of the heat plate 3 is decreased once. Then, heat generated from the heater 31 is radiated from the heat plate 3 to the wafer W so that the temperature of the wafer W is increased. Along with this, the temperature of the heat plate 3 is increased to reach the process temperature, and is ultimately stabilized at the process temperature. In this manner, the wafer W is subjected to heat treatment (step S2). After a predetermined period of time, for example 60 seconds, from the point of time when the wafer W is placed on the heat plate 3, the wafer W is pushed up by the lift pins 14 and the lid 21 is lifted up to be opened. Subsequently, the wafer W is picked up by the wafer transfer mechanism 12 and is moved to the standby position. The wafer W is delivered from the wafer transfer mechanism 12 to the external main transfer mechanism by the operation reverse to the above-described loading operation.

In such a series of processes for the wafer W, the temperature detection value of the heat plate 3, the power command value and the suction pressure detection value are sampled for a predetermined period of time, as described above in detail, from several seconds before the wafer W is mounted on the heat plate 3 (step S3). The time-series data thus obtained are inputted to the neural network 5 where the occurrence probabilities of the event modes shown in FIG. 5 are obtained (step S4). The correspondence process shown in FIG. 8 is selected based on these occurrence probabilities, as described above (step S5).

The advantages of using the neural network 5 will now be described. In comparison with a case where an unwarped wafer W is mounted on the heat plate 3, profiles of the time-series data of the temperature detection value, the power command value and the suction pressure detection value are different due to the presence of warping when a warped wafer W is mounted on the heat plate 3. That is to say, arrangements of input values inputted to a group of nodes of the input layer are different between when the wafer W is warped and when the wafer W is not warped. In addition, even for the loading of the wafer W, the profiles of time-series data of the temperature detection value, the power command value and the suction pressure detection value are different from those in the normal state, and are also different from those when the wafer warping is abnormal. Even for the heat plate cracking and the VAC valve breakdown, the profiles of time-series data of the temperature detection value, the power command value and the suction pressure detection value are different from those in the normal state and are also different from those in the other abnormal modes. That is to say, for the wafer warping, the wafer boarding, the heat plate cracking and the VAC valve breakdown, the above-described arrangements of the time-series data (the arrangements of the input values of the input layer) are specific to respective abnormality modes. In the case of the presence of the heat plate cracking and/or the VAC valve breakdown, and in the case of the presence of the heat plate cracking and/or the VAC valve breakdown in addition to the presence of the wafer warping or the wafer boarding, arrangements of the time series described above are also different from each other.

Therefore, for example, for each of a state in which one of the four abnormality modes has occurred and a state in which two or more of the four abnormality modes have occurred, actual time-series data are inputted to the neural network 5 to adjust the parameters of the neural network 5 so that the accuracy of estimation of the occurrence probability of the respective abnormality mode is increased. This makes it possible to estimate with high precision which abnormality mode has occurred. For example, even when it was conventionally difficult to determine whether the wafer boarding has occurred or whether the heat plate 3 has been damaged or broken, it is possible to estimate an abnormal mode with high accuracy. The estimation of each abnormality mode can be made based on the occurrence probability and an appropriate correspondence process can be allocated according to the occurrence probability for each abnormality mode.

According to the above embodiment, a plurality of types of physical quantities such as the temperature of the heat plate 3, which are set as the operation conditions of the heat treatment apparatus, are detected, and a group of time-series detection values obtained for each of the various physical quantity detection values is inputted to the neural network 5. Then, by the neural network 5, the occurrence probability for each of the plurality of abnormality modes is obtained and a correspondence process to be taken is selected from a plurality of correspondence processes according to the occurrence probability of each abnormality mode. Therefore, it is possible to distinguish between the abnormality modes and it is also possible to take appropriate measures against abnormalities occurring during the operation of the heat treatment apparatus. In addition, in a case where the conditions for selecting a plurality of correspondence processes are established corresponding to the occurrence probability of each of the plurality of abnormality modes, since the highest level correspondence process among the plurality of correspondence processes is selected, namely since a respective correspondence process is determined from the viewpoint of safety, it is possible to prevent a decrease in production efficiency beforehand.

In the above embodiment, the input data of the neural network 5 are the detection values of the temperature sensors 35a to 35c, the detection value of the suction pressure detector 39 and the power command value corresponding to each of the heaters 31a to 31c. However, for example, a power detection value may be used instead of the power command value, as described above. In addition, the heat treatment apparatus may have a configuration without the suction holes 36, namely a configuration without a vacuum chuck. In this case, for example, time-series data of the temperature detection value and time-series data of the power command value (or the power detection value) are used as the input data of the neural network 5. Further, in the above embodiment, the heat plate 3 also serves as a mounting plate. However, the present disclosure can also be applied to a heat treatment apparatus having a configuration in which a heating lamp is disposed below a mounting plate made of, e.g., quartz and a wafer is heated with an infrared ray transmitted from the heating lamp through the mounting plate. A substrate to be subjected to the heat treatment is not limited to a wafer but may be a glass substrate for a liquid crystal panel.

The present inventors conducted an evaluation test in advance in order to check that the present disclosure is effective. In this evaluation test, a heat plate equipped with 7-channel heaters was used, 300 detection values were used for each time-series data of temperature for each channel, and a total of 2,100 detection values for 7 channels were inputted to the input layer of the neural network. Then, a supervised learning was carried out for respective modes (event modes) in which the mounting state of the wafer is the wafer boarding and normality, and the values of parameters used for the neural network was pursued. A correct answer rate using test data with these parameters was examined. This examination showed an extremely high correct answer rate. 1,000 sets of 2,100 temperature detection values used for the supervised learning were prepared. These 1,000 sets of temperature detection values were also prepared for the test data.

According to the present disclosure in some embodiments, in heating a substrate mounted on a mounting plate heated by a heating part, a plurality of types of physical quantities such as the temperature of the mounting plate set as operation conditions are detected, and a group of time-series detection values obtained for each of the various physical quantity detection values is inputted to a neural network. By the neural network, the occurrence probability for each of a plurality of abnormality modes is obtained and a correspondence process to be taken is selected from a plurality of correspondence processes according to the occurrence probability of each abnormality mode. Therefore, it is possible to distinguish between the abnormality modes for abnormal aspects (abnormality modes) occurring during the operation of a heat treatment apparatus. That is to say, it is possible to estimate which abnormality mode has a high occurrence probability, which makes it possible to take appropriate measures against abnormalities occurring during the operation of the heat treatment apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus that includes a mounting plate and heats a substrate mounted on the mounting plate heated by a heater, the mounting plate being disposed inside a processing container and having a plurality of protrusions formed on a surface of the mounting plate to avoid contact between the substrate and the surface of the mounting plate, comprising:
    a plurality of types of physical quantity detectors configured to detect a plurality of types of physical quantities set as operation conditions, respectively;
    a state estimating part configured to estimate a plurality of occurrence probabilities occurring for a plurality of predetermined abnormality modes, respectively, by a neural network, the state estimating part including an input layer to which a group of time-series detection values obtained for each of a plurality of types of physical quantity detection values detected respectively by the plurality of types of physical quantity detectors is inputted; and
    a selector configured to select one of a plurality of correspondence processes based on the plurality of occurrence probabilities for the plurality of predetermined abnormality modes estimated by the state estimating part,
    wherein one of the plurality of types of physical quantity detection values is a temperature detection value detected by a temperature physical quantity detector configured to detect a temperature of the mounting plate among the plurality of types of physical quantity detectors, and
    wherein the plurality of predetermined abnormality modes include at least one abnormality with the substrate and at least one abnormality with the heat treatment apparatus.

2. The heat treatment apparatus of claim 1, further comprising a power control circuit that comprises:
    a resistance heating element located in the mounting plate and constituting the heater; and
    a power supply configured to supply a power to the resistance heating element,
    wherein the power control circuit is configured to generate a power command value to control the power supply to supply the power based on a deviation between the temperature detection value and a temperature target value, and
    wherein the plurality of types of physical quantity detection values include the power command value in addition to the temperature detection value.

3. The heat treatment apparatus of claim 1, further comprising a power control circuit that comprises:
    a resistance heating element installed in the mounting plate and constituting the heater; and
    a power supply configured to supply a power to the resistance heating element,
    wherein the power control circuit is configured to generate a power command value to control the power supply to supply the power based on a deviation between the temperature detection value and a temperature target value, and
    wherein the plurality of types of physical quantity detection values include the power command value in addition to the temperature detection value.

4. The heat treatment apparatus of claim 1, wherein the plurality of predetermined abnormality modes include a predetermined state in which a substrate is warped.

5. The heat treatment apparatus of claim 1, wherein the plurality of predetermined abnormality modes include a predetermined state in which a substrate boards on a foreign matter and is abnormally mounted.

6. The heat treatment apparatus of claim 1, wherein the plurality of predetermined abnormality modes include a predetermined state in which the mounting plate is damaged.

7. The heat treatment apparatus of claim 1, further comprising:
    a suction path that is connected to a suction port opened in the surface of the mounting plate so as to pull the substrate toward the mounting plate,
    wherein the plurality of types of physical quantity detection values include a detection value of a suction pressure of the suction path in addition to the temperature detection value.

8. The heat treatment apparatus of claim 1, wherein the plurality of correspondence processes which are selected by the selector include at least one of continuing a heat treatment, warning of an abnormality while continuing the heat treatment, marking by a computer on a process history data of the substrate while continuing the heat treatment and warning of the abnormality, and stopping the heat treatment.

9. The heat treatment apparatus of claim 1, wherein the plurality of correspondence processes are respectively determined for magnitudes of the occurrence probabilities of the plurality of predetermined abnormality modes, and a plurality of levels are determined in advance for the plurality of correspondence processes, respectively, and
    wherein when a condition for selecting each of the plurality of correspondence processes is established corresponding to the plurality of occurrence probabilities for the plurality of predetermined abnormality modes, the selector selects a correspondence process of a highest level among the plurality of levels for the plurality of correspondence processes.

10. A method of managing a heat treatment apparatus that includes a mounting plate and heats a substrate mounted on the mounting plate heated by a heater, the mounting plate being disposed inside a processing container and having a plurality of protrusions formed on a surface of the mounting plate to avoid contact between the substrate and the surface of the mounting plate, the method comprising:
    detecting a plurality of types of physical quantities set as operation conditions at least in a time zone after the substrate is mounted on the mounting plate;
    inputting a group of time-series detection values obtained for each of a plurality of types of physical quantity detection values detected in the detecting to an input layer, and obtaining a plurality of occurrence probabilities occurring for a plurality of predetermined abnormality modes, respectively, by a neural network; and
    selecting one of a plurality of correspondence processes based on the plurality of occurrence probabilities for the plurality of predetermined abnormality modes, wherein one of the plurality of types of physical quantity detection values is a temperature detection value of the mounting plate detected in the detecting,, and wherein the plurality of predetermined abnormality modes include at least one abnormality with the substrate and at least one abnormality with the heat treatment apparatus.

11. A non-transitory computer-readable storage medium storing a computer program used for a heat treatment apparatus that includes a mounting plate and heats a substrate mounted on the mounting plate heated by a heater, the mounting plate being disposed inside a processing container and having a plurality of protrusions formed on a surface of the mounting plate to avoid contact between the substrate and the surface of the mounting plate, wherein the computer program includes a group of steps organized to perform the method of claim 10.

12. The heat treatment apparatus of claim 1, wherein the at least one abnormality with the heat treatment apparatus includes at least one of a predetermined state in which a VAC solenoid breakdown occurs and a predetermined state in which a heat plate cracking occurs.

13. The method of managing the heat treatment apparatus of claim 10, wherein the at least one abnormality with the heat treatment apparatus includes at least one of a predetermined state in which a VAC solenoid breakdown occurs and a predetermined state in which a heat plate cracking occurs.

* * * * *